US010388198B2

(12) United States Patent
Hashimoto et al.

(10) Patent No.: US 10,388,198 B2
(45) Date of Patent: Aug. 20, 2019

(54) VEHICULAR DISPLAY DEVICE

(71) Applicant: Yazaki Corporation, Tokyo (JP)

(72) Inventors: Ryuichi Hashimoto, Shizuoka (JP); Harutada Hojo, Shimada (JP); Naoya Iguchi, Shimada (JP)

(73) Assignee: YAZAKI CORPORATION, Minato-ku, Tokyo (JP)

(*) Notice: Subject to any disclaimer, the term of this patent is extended or adjusted under 35 U.S.C. 154(b) by 0 days.

(21) Appl. No.: 15/825,415

(22) Filed: Nov. 29, 2017

(65) Prior Publication Data

US 2018/0218654 A1 Aug. 2, 2018

(30) Foreign Application Priority Data

Jan. 31, 2017 (JP) ................................ 2017-015352

(51) Int. Cl.

*G02F 1/1333* (2006.01)
*G09G 3/00* (2006.01)
*G09G 3/36* (2006.01)
*B60R 11/02* (2006.01)
*H05K 5/00* (2006.01)
(Continued)

(52) U.S. Cl.

CPC ............ *G09G 3/001* (2013.01); *B60K 37/02* (2013.01); *B60R 11/0229* (2013.01); *G09G 3/36* (2013.01); *H05K 5/0069* (2013.01); *H05K 7/1417* (2013.01); *B60K 2350/106* (2013.01); *B60Y 2200/10* (2013.01)

(58) Field of Classification Search

CPC ......... G09G 3/001; G02B 6/0071; H04N 5/64
USPC ...................... 349/58; 340/691.6; 362/23.17
See application file for complete search history.

(56) References Cited

U.S. PATENT DOCUMENTS 5,678,912 A * 10/1997 Ayres .................... B60K 37/02 362/23.17
6,414,650 B1 * 7/2002 Nicholson .............. G06F 3/147 345/1.1

(Continued)

FOREIGN PATENT DOCUMENTS

JP 2002-328621 A 11/2002
JP 2006-350217 A 12/2006

(Continued)

OTHER PUBLICATIONS

Japanese Office Action dated Mar. 26, 2019 in corresponding Japanese Patent Application No. 2017-015352.

*Primary Examiner* — Munear T Akki
(74) *Attorney, Agent, or Firm* — Sughrue Mion, PLLC

(57) ABSTRACT

A vehicular display device includes an image display device, a circuit board, a casing, and fastening members. The image display device includes a plurality of boss parts having a proximal portion having a contact surface capable of being brought into contact with the circuit board on a distal end in a first direction; an insertion portion formed in a projecting manner from the distal end of the proximal portion and being capable of being inserted into a board fastening hole of the circuit board and a casing fastening hole of the casing along the first direction; and a threadedly engaging hole formed from the distal end of the insertion portion in the first direction toward the proximal portion along the first direction, the fastening members being capable of being threadedly engaged with the threadedly engaging hole.

3 Claims, 4 Drawing Sheets

(51) Int. Cl.
*H05K 7/14* (2006.01)
*B60K 37/02* (2006.01)

(56) References Cited

U.S. PATENT DOCUMENTS

| | | | | |
|---|---|---|---|---|
| 8,125,771 | B2 * | 2/2012 | Yukawa | G06F 1/16 313/582 |
| 2006/0215072 | A1 * | 9/2006 | Hashino | G02B 6/0071 349/58 |
| 2006/0290835 | A1 | 12/2006 | Sakuma | |
| 2007/0146262 | A1 | 6/2007 | Ogasawara et al. | |
| 2008/0192169 | A1 * | 8/2008 | Makino | G02F 1/133308 349/58 |
| 2008/0317545 | A1 * | 12/2008 | Hirose | F16B 5/025 403/14 |
| 2009/0290089 | A1 | 11/2009 | Ichioka et al. | |
| 2010/0053912 | A1 * | 3/2010 | Harita | H04N 5/64 361/752 |
| 2011/0188192 | A1 | 8/2011 | Yokota et al. | |

FOREIGN PATENT DOCUMENTS

| | | | |
|---|---|---|---|
| JP | 2007-178179 | A | 7/2007 |
| JP | 2008-058222 | A | 3/2008 |
| JP | 2008-059993 | A | 3/2008 |
| JP | 2010-019726 | A | 1/2010 |
| WO | 2008/018233 | A1 | 2/2008 |

* cited by examiner

VEHICULAR DISPLAY DEVICE

CROSS-REFERENCE TO RELATED APPLICATION(S)

The present application claims priority to and incorporates by reference the entire contents of Japanese Patent Application No. 2017-015352 filed in Japan on Jan. 31, 2017.

BACKGROUND OF THE INVENTION

1. Field of the Invention

The present invention relates to a vehicular display device.

2. Description of the Related Art

As a conventional vehicular display device, for example, Japanese Patent Application Laid-open No. 2007-178179 discloses a liquid crystal display meter that displays a dial plate and a pointer on a screen of a liquid crystal panel.

Here, in the liquid crystal display meter described in Japanese Patent Application Laid-open No. 2007-178179, a mutual fixing structure of components, such as an image display device (a liquid crystal panel), a circuit board that controls the image display device, and a casing that houses these components, leaves much room for improvement.

SUMMARY OF THE INVENTION

The present invention has been made in view of the above circumstances, and aims to provide a vehicular display device in which constitutional components are properly fixed each other.

A vehicular display device according to one aspect of the present invention includes an image display device configured to display an image with respect to vehicle information, and including a plurality of boss parts; a circuit board arranged to face the image display device along a first direction, configured to control the image display device, and having a plurality of board fastening holes formed at respective positions opposed to the boss parts along the first direction in a penetrating manner along the first direction; a casing arranged to face the circuit board along the first direction on a side opposite to the image display device with respect to the circuit board, configured to house the image display device and the circuit board, and having a plurality of casing fastening holes formed at respective positions opposed to the boss parts along the first direction in a penetrating manner along the first direction; and a plurality of fastening members configured to fasten and fix the image display device, the circuit board, and the casing to each other by way of the boss parts, the board fastening holes, and the casing fastening holes, wherein the boss parts include: a proximal portion formed in a projecting manner along the first direction, and having a contact surface capable of being brought into contact with the circuit board on a distal end in the first direction; an insertion portion formed in a projecting manner along the first direction from the distal end of the proximal portion in the first direction and being capable of being inserted into the board fastening holes and the casing fastening holes along the first direction; and a threadedly engaging hole formed from the distal end of the insertion portion in the first direction toward the proximal portion along the first direction, the fastening members being capable of being threadedly engaged with the threadedly engaging hole, and the boss parts fix the circuit board and the casing sandwiched between the fastening members threadedly engaged with the threadedly engaging hole along the first direction and the contact surface.

According to another aspect of the present invention, in the vehicular display device, the casing, the fastening members, and the boss parts may be composed of a metal material having conductivity, and the image display device, the circuit board, and the casing may be electrically conductive via the boss parts and the fastening members, and grounded via the circuit board.

According to still another aspect of the present invention, in the vehicular display device, the image display device may be include a display device body configured to display an image with respect to the vehicle information, and a cover provided with the boss parts, the cover being attached to the display device body in a detachable manner.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention is specifically explained based on drawings. Here, the present invention is not limited to the embodiment. Furthermore, constitutional features in the following embodiment include a part that can easily be effected by those skilled in the art, or parts substantially identical with each other.

Embodiment

Figure 1:
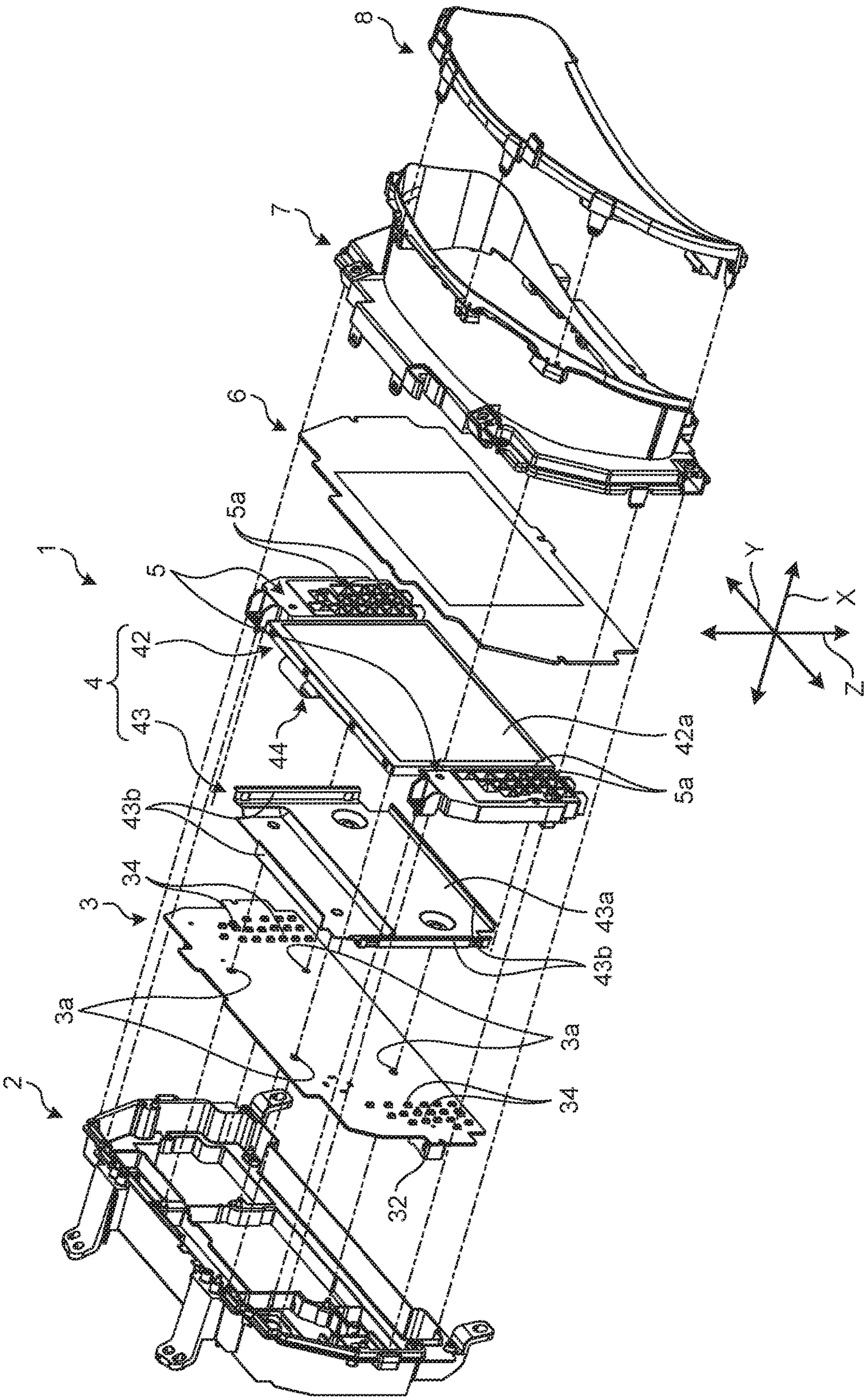
FIG. 1 is an exploded perspective view illustrating a schematic structure of a vehicular display device according to an embodiment.
Figure 2:
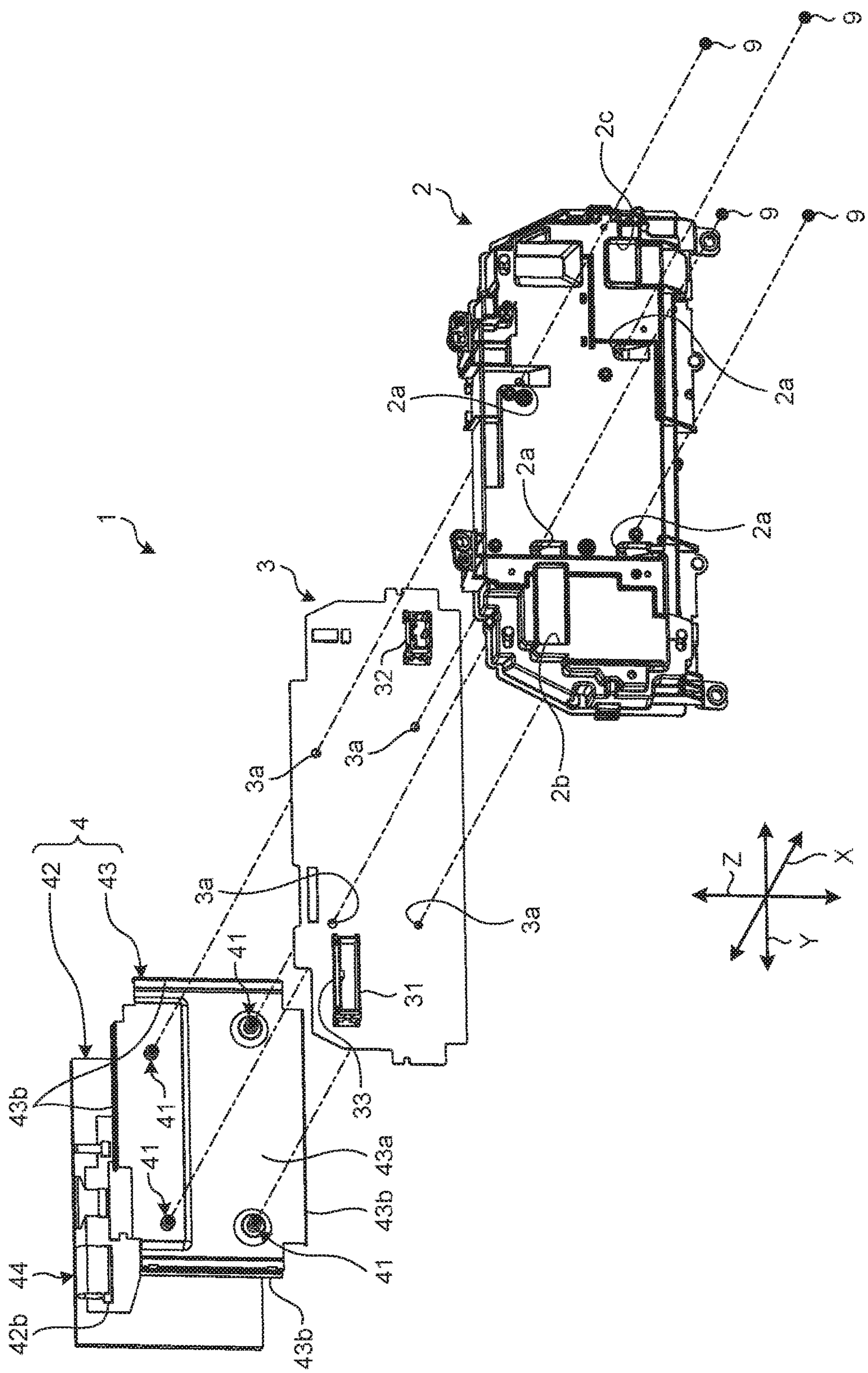
FIG. 2 is a partially exploded perspective view illustrating the schematic structure of the vehicular display device according to the embodiment.

A vehicular display device 1 according to the present embodiment constitutes what is called an in-vehicle meter, the vehicular display device 1 being illustrated in FIG. 1 and FIG. 2. The vehicular display device 1 is, for example, mounted on an instrument panel provided to a dashboard of a vehicle, and displays various kinds of information with respect to the vehicle as information provided for the driving of the vehicle.

Here, a depth direction X as a first direction of the vehicular display device 1 illustrated in FIG. 1 or the like typically corresponds to the longitudinal direction of a vehicle to which the vehicular display device 1 is applied. Furthermore, the front face side of the vehicular display device 1 is a side facing the driver's seat of the vehicle in the depth direction X, and typically corresponds to a side of the vehicular display device 1 that is visually recognized by a driver sitting on the driver's seat. On the other hand, the back face side of the vehicular display device 1 is a side opposite to the front face side of the vehicular display device 1 in the depth direction X, and typically corresponds to a side of the vehicular display device 1 that is housed in the inside of an instrument panel. Furthermore, a width direction Y as a second direction of the vehicular display device 1 typically corresponds to the vehicle width direction of the vehicle to which the vehicular display device 1 is applied. In the following explanation, there may be a case in which the left side toward the front face of the vehicular display device 1 in the width direction Y of the vehicular display device 1 is referred to as "width direction-Y left side", and the right side toward the front face of the vehicular display device 1 in the width direction Y of the vehicular display device 1 is referred to as "width direction-Y right side". A height direction Z as a third direction of the vehicular display device 1 typically corresponds to the height direction of the vehicle to which the vehicular display device 1 is applied, and the height direction Z is, for example, a direction along the perpendicular direction of the vehicle in a state that the vehicle is placed on a horizontal surface. Unless otherwise noted, each direction used in the following explanation indicates a direction in a state that the vehicular display device 1 including constitutional features attached to each other is attached to the instrument panel.

To be more specific, the vehicular display device 1 is provided with a casing 2, a circuit board 3, an image display device 4, a lamp case 5, a dial plate 6, a facing member 7, a transparent member 8, and a plurality of fastening members 9, the vehicular display device 1 being configured to display an image with respect to vehicle information on the image display device 4. The vehicular display device 1 has a structure in which the casing 2, the circuit board 3, the image display device 4, the lamp case 5, the dial plate 6, the facing member 7, and the transparent member 8 are stacked on each other in the order given above from the back face side toward the front face side in the depth direction X.

The casing 2 houses various kinds of components attached thereto, the components constituting the vehicular display device 1. The casing 2 is arranged to face the circuit board 3 at a position opposite to the image display device 4 with respect to the circuit board 3 along the depth direction X. That is, the casing 2 is arranged at a position opposite to the image display device 4 with respect to the circuit board 3 sandwiched between the casing 2 and the image display device 4 along the depth direction X. The casing 2 is formed in a dish-like shape (tray-like shape) in such a manner that the circuit board 3 side of the casing 2 in the depth direction X constitutes a recessed portion, and houses the circuit board 3, the image display device 4, the lamp case 5, and the like that are attached to each other in an internal space in the recessed portion. The casing 2 according to the present embodiment is composed of a metal material having conductivity, such as a magnesium alloy. Due to such a structure, the casing 2 ensures the sufficient strength thereof for properly supporting various kinds of components attached thereto, and also functions as a noise suppression part that blocks noises generated from the various kinds of components. Furthermore, the casing 2 is provided with fixing parts for fixing the various kinds of components. Here, the casing 2 has a plurality of casing fastening holes 2*a* for fastening the circuit board 3 and the image display device 4 thereto, as the fixing parts. Each of the plurality of casing fastening holes 2*a* is formed in a penetrating manner through the casing 2 along the depth direction X. Here, a total of four casing fastening holes 2*a* are formed in the casing 2. The plurality of casing fastening holes 2*a* are formed one by one at respective positions opposed to a board fastening hole 3*a* and a boss part 41 that are described below, along the depth direction X. Each of the casing fastening holes 2*a* is formed in a substantially circular shape. Although the casing 2 includes, as the fixing part, a casing fastening hole for fastening the lamp case 5 thereto, an engagement part for engaging the facing member 7 therewith, and the like, in addition to the casing fastening hole 2*a*, their explanations are omitted here.

The circuit board 3 is electrically connected with the image display device 4 to control the image display device 4. The circuit board 3 is arranged to face the casing 2 and the image display device 4 along the depth direction X. That is, the circuit board 3 is arranged between the casing 2 and the image display device 4 along the depth direction X. The circuit board 3 is formed in a substantially rectangular plate shape capable of being housed in the internal space in the recessed portion of the casing 2. The circuit board 3 mounts thereon various kinds of electronic components for achieving various functions in the vehicular display device 1. The circuit board 3 constitutes electronic circuits each of which electrically connects the electronic components mounted on the circuit board 3 with each other, and is what is called a printed circuit board here. The circuit board 3 constitutes various kinds of circuits formed by printing a wiring pattern (print pattern) with the use of a conductive material such as a copper material on an insulating layer composed of an insulative material, such as an epoxy resin, a glass epoxy resin, a paper epoxy resin, or ceramics. Furthermore, in the circuit board 3, electronic components or the like are electrically connected with the wiring pattern by soldering or the like thus mounting the electronic components on the circuit board 3. The circuit board 3 mounts, for example, connectors 31, 32, 33, and the like on the back face-side mounting surface thereof in the depth direction X; that is, on the casing 2 side mounting surface thereof. The connectors 31 and 32 are exposed to the outside of the casing 2 by way of respective openings 2*b* and 2*c* or the like that are formed in the casing 2. Each of the connectors 31 and 32 fits therein a connector provided to the end of a wiring material, such as an electric wire, thus electrically connecting the circuit board 3 and the wiring material with each other. The connector 33 fits therein a terminal provided to the end of a wiring material 44 mentioned below thus electrically connecting the circuit board 3 and the image display device 4 with each other. The circuit board 3 mounts, for example, a plurality of light sources 34 or the like on the front face-side mounting surface thereof in the depth direction X; that is, on the image display device 4 side (lamp case 5 side) mounting surface thereof. The light source 34 is a light source for luminously displaying various kinds of alarm lamps (warning lamps, what is called telltale) or the like. Although the light source 34 is constituted of light emitting diode (LED) elements or the like, the present embodiment is not limited to this example. Furthermore, the circuit board 3 has the plurality of board fastening holes 3*a* for fastening the circuit board 3 to the casing 2. Each of the plurality of board fastening holes 3*a* is formed in a penetrating manner through the circuit board 3 along the depth direction X. Here, a total of four board fastening holes 3*a* are formed in the circuit board 3 in the same manner as the case of the casing fastening holes 2*a*. The plurality of board fastening holes 3*a* are formed one by one at respective positions opposed to the casing fastening holes 2*a* described above and boss parts 41 described below along the depth direction X. Each of the board fastening holes 3*a* is formed in an approximately circular shape having a diameter substantially equal to that of the casing fastening hole 2*a*.

The image display device 4 displays an image with respect to vehicle information. The image display device 4 is arranged to face the circuit board 3 at a position opposite to the casing 2 with respect to the circuit board 3 along the depth direction X. That is, the image display device 4 is arranged at a position opposite to the casing 2 with respect to the circuit board 3 sandwiched between the casing 2 and the image display device 4 along the depth direction X. The image display device 4 has the plurality of boss parts 41 for fastening and fixing the image display device 4 to the casing 2. The image display device 4 according to the present embodiment includes a display device body 42 and a cover 43 to which the boss parts 41 are provided.

The display device body 42 is a main part having a function for displaying an image thereon in the image display device 4. The display device body 42 is formed in a substantially rectangular plate shape, and has an image display surface 42*a* arranged on the front face side thereof in the depth direction X; that is, on the dial plate 6 side thereof. The image display surface 42*a* faces the front face side of the image display device 4 in the depth direction X, and is exposed on the front face side of the vehicular display device 1 in the depth direction X by way of the dial plate 6 and the like; that is, on the viewing position side of the vehicular display device 1. The display device body 42 displays an image with respect to vehicle information on the image display surface 42*a* thereof. As for the display device body 42, for example, a liquid crystal display using the thin film transistor (TFT) can be used. The display device body 42 is not limited to this example, and a flat-screen plasma display, an organic electroluminescence display, or the like can also be used for the display device body 42. The images with respect to the vehicle information, being displayed on the image display surface 42*a*, may include the images of operation information with respect to various driving styles changing every moment in driving a vehicle, such as the speed of a vehicle, the output rotational speed of a power source for traveling, an accumulated travel distance, a cooling water temperature, a fuel residual quantity, a battery power storage amount, navigation information, map information, crossing information, the information with respect to energy-saving travelling, various kinds of alarm lamps (warning lamps, what is called telltale), a shift position indicator, a direction indicator symbol, or the like. The display device body 42 is electrically connected with the circuit board 3 via the wiring material 44, and driven and controlled by the circuit board 3 to display various kinds of images on the image display surface 42*a*.

Figure 3:
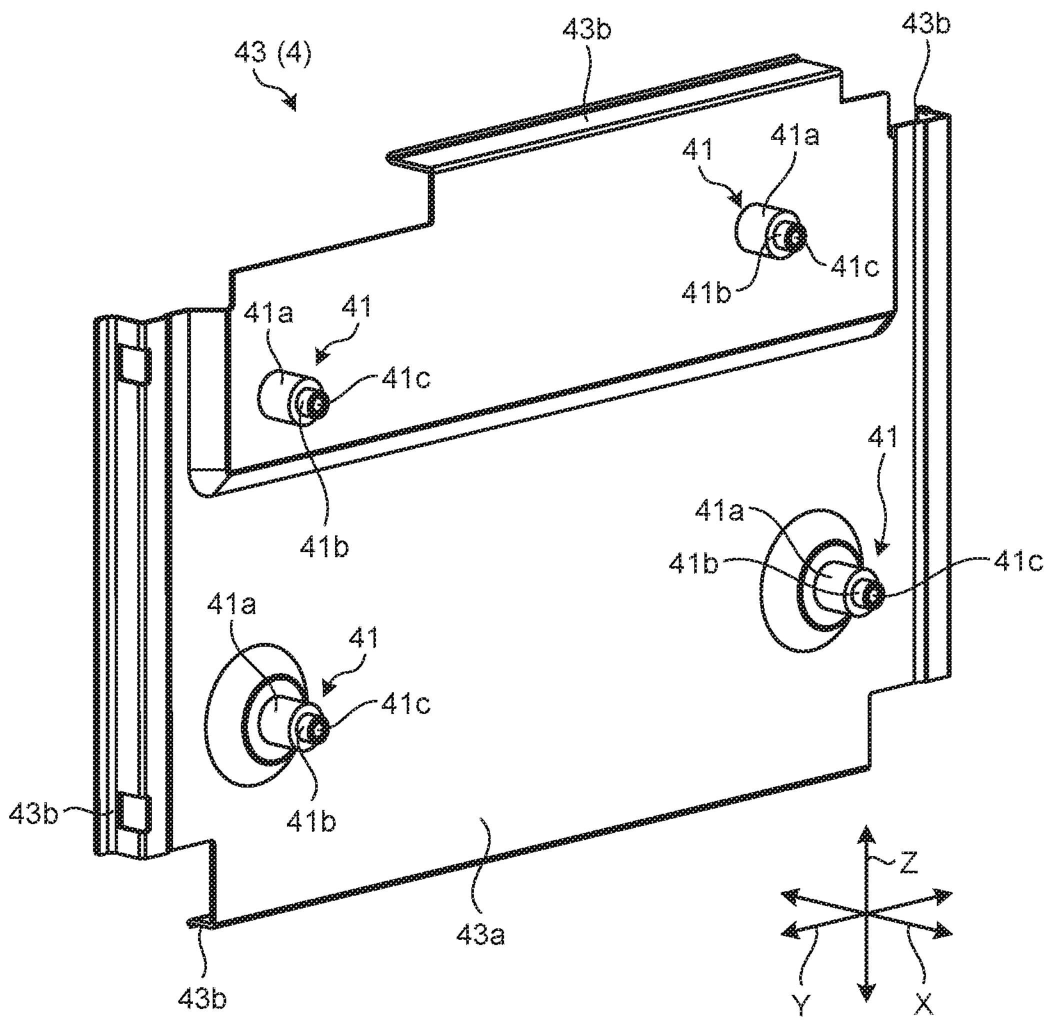
FIG. 3 is a perspective view illustrating a schematic structure of a cover of the vehicular display device according to the embodiment.
Figure 4:
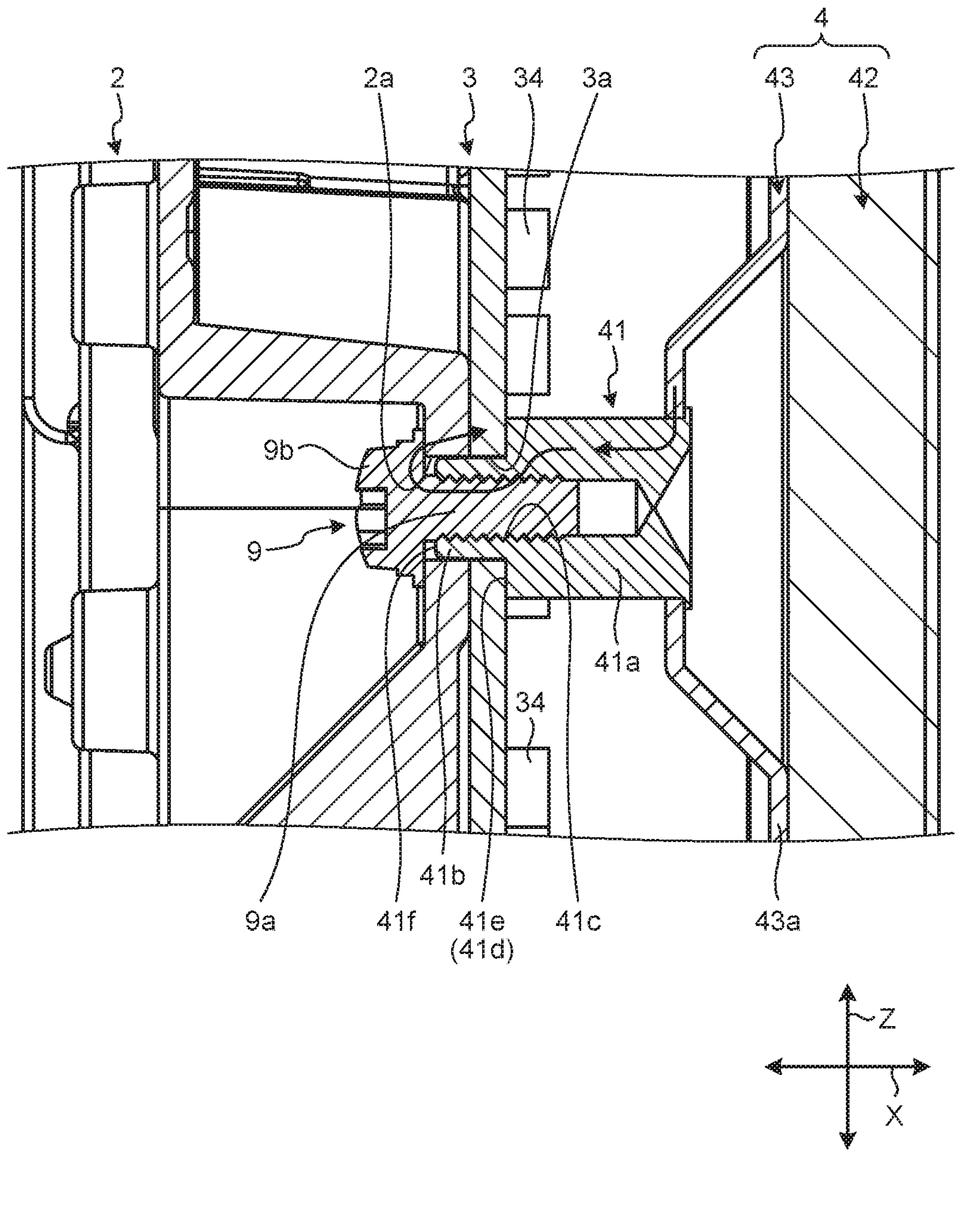
FIG. 4 is a partially sectional view illustrating a boss part of the vehicular display device according to the embodiment.

The cover 43 is provided to the display device body 42 in a detachable manner. The cover 43 is attached to the display device body 42 on the back face side of the display device body 42 in the depth direction X; that is, on a surface opposite to the image display surface 42*a*. That is, the cover 43 is attached to the display device body 42 on the surface of the display device body 42 that faces the circuit board 3 in the depth direction X, and interposed between the circuit board 3 and the display device body 42 in the depth direction X. Furthermore, the cover 43 has the plurality of boss parts 41, and is fastened and fixed to the casing 2 by way of the boss parts 41 thus functioning as a holder that holds the display device body 42 on the casing 2. The cover 43 including the boss parts 41 is composed of a metal material having conductivity. To be more specific, the cover 43 has a plate-like portion 43*a* and frame-shaped holding parts 43*b* (see FIG. 3 also). The plate-like portion 43*a* is formed in a substantially rectangular plate shape whose plate thickness direction coincides with the depth direction X. The plate-like portion 43*a* extends in the width direction Y and in the height direction Z, and is formed into a size sufficient to cover the greater part of the back face-side surfaces of the display device body 42 in the depth direction X. The plate-like portion 43*a* is partially provided with a cutout portion and an uneven part. The frame-shaped holding part 43*b* is formed in a substantially perpendicularly crooked manner towards the front face side thereof in the depth direction X at a part of each of sides (four sides) of the plate-like portion 43*a* to constitute a spring support part. A pair of frame-shaped holding parts 43*b* facing each other along the width direction Y sandwiches the display device body 42 along the width direction Y to support the display device body 42. The pair of frame-shaped holding parts 43*b* facing each other along the height direction Z sandwiches the display device body 42 along the height direction Z to support the display device body 42. The cover 43 holds the display device body 42 in the space formed by the plate-like portion 43*a* and the respective frame-shaped holding parts 43*b*, and is attached to the display device body 42 while maintaining the positional relation in which the respective frame-shaped holding parts 43*b* support the display device body 42 from four sides along the width direction Y and the height direction Z. Furthermore, the cover 43 is provided with the plurality of boss parts 41 arranged in the plate-like portion 43*a* thereof. The boss part 41 is a part for fastening and fixing the image display device 4 to the casing 2 simultaneously with the circuit board 3 by threadedly engaging the fastening member 9 described below into the boss part 41. Each of the plurality of boss parts 41 is formed in a columnar shape projecting along the depth direction X from the back face side of the plate-like portion 43*a* of the cover 43 in the depth direction X; that is, from the face of the plate-like portion 43*a* of the cover 43 that faces the circuit board 3 in the depth direction X. Here, a total of four boss parts 41 are formed in the cover 43 in the same manner as the case of the casing fastening holes 2*a* or the board fastening holes 3*a*. The plurality of boss parts 41 are formed one by one at respective positions opposed to the casing fastening holes 2*a* and the board fastening holes 3*a* along depth direction X. The image display device 4 is housed in the internal space in the recessed portion of the casing 2, and fastened and fixed to the casing 2 by way of the boss parts 41 and the fastening members 9. In this case, in the image display device 4, the cover 43 is fastened and fixed to the casing 2, and the display device body 42 is held by the cover 43. Here, the constitution of the boss part 41 is specifically explained later with reference to FIG. 3, FIG. 4, or the like.

The lamp case 5 houses the plurality of light sources 34 mounted on the front face side of the circuit board 3 in the depth direction X. The lamp case 5 is arranged to face the circuit board 3 at a position opposite to the casing 2 with respect to the circuit board 3 along the depth direction X. Here, a total of two lamp cases 5 are arranged one by one at respective positions adjacent to both sides of the image display device 4 in the width direction Y. Each of the lamp cases 5 has a plurality of cavities 5*a* each of which opens to both sides thereof in the depth direction X, and houses the light sources 34 in the respective cavities 5*a*. The lamp case 5 is composed of a resin material or the like that has insulation properties. Each of the lamp cases 5 is housed in the internal space in the recessed portion of the casing 2, and fastened and fixed to the casing 2 by way of fastening members, such as screw bolts.

The dial plate 6 is a plate-like member on which patterns, such as various kinds of symbols, characters, scales, and decorations, corresponding to the information displayed on the vehicular display device 1 are drawn (the illustrations of the patterns are omitted here, for the sake of simplification.) The dial plate 6 is arranged to face the image display device 4 and the lamp case 5 on a side opposite to the circuit board 3 with respect to the image display device 4 along the depth direction X. That is, the dial plate 6 is arranged to face the image display device 4 and the lamp case 5 on the front face side of the image display device 4 and the lamp case 5 in the depth direction X. The dial plate 6 is, for example, a sheet composed of a transparent polycarbonate material, the sheet having an area in a dark-color bordered rectangle containing the patterns mentioned above on the surface thereof, the area being formed by printing with the use of dark-colored ink. The patterns are thus drawn on the surface of the dial plate 6. In the dial plate 6, for example, the light emitted from the light source 34 passes through the part where the patterns with respect to various kinds of alarm lamps (warning lamps, what is called telltale) to be luminously displayed by the light source 34 are drawn thus luminously displaying the patterns. Furthermore, the dial plate 6 exposes a transparent area through which light passes to the front face side of the vehicular display device 1 in the depth direction X, or exposes the image display surface 42*a* of the display device body 42 to the front face side of the vehicular display device 1 by way of an opening area of the dial plate 6 in the depth direction X; that is, to the viewing position side of the vehicular display device 1. The dial plate 6 is arranged in an interposed and sandwiched manner between the casing 2 and the facing member 7 in the depth direction X.

The facing member 7 is a part that encloses the periphery of the dial plate 6, and holds the dial plate 6 between the facing member 7 and the casings 2. The facing member 7 is arranged to face the dial plate 6 on a side opposite to the image display device 4 and the lamp case 5 with respect to the dial plate 6 along the depth direction X. That is, the facing member 7 is arranged to face the dial plate 6 on the front face side of the dial plate 6 in the depth direction X. The facing member 7 is composed of a resin material or the like that has insulation properties. The facing member 7 is engaged with and fixed to the engagement part of the casing 2 to hold the dial plate 6 sandwiched between the facing member 7 and the casings 2 in the depth direction X, and exposes the area of the dial plate 6 on which the patterns are drawn and the image display surface 42*a* to the front face side of the vehicular display device 1 in the depth direction X; that is, to the viewing position side of the vehicular display device 1.

The transparent member 8 is a protection member having light transmissive properties, and is attached to the front face side of the facing member 7 in the depth direction X. The transparent member 8 is engaged with the facing member 7 by way of an engagement part. The transparent member 8 covers and protects the front face side of the image display surface 42*a* and the dial plate 6 in the depth direction X; that is, the viewing position side of the image display surface 42*a* and the dial plate 6.

The plurality of fastening members 9 fastens and fixes the casing 2, the circuit board 3, and the image display device 4 to each other by way of the respective casing fastening holes 2*a*, the respective board fastening holes 3*a*, and the respective boss parts 41. The fastening member 9 is typically a fastening bolt capable of being threadedly engaged with each of the boss parts 41. The fastening member 9 includes a shank 9*a* and a head 9*b*. The shank 9*a* is formed in a substantially columnar shape, and forms a thread groove in the outer peripheral face thereof. The head 9*b* is a part to which fastening torque is applied with a tool or the like, and is formed in a shape having a diameter larger than that of the shank 9*a*. In the fastening member 9, the shank 9*a* and the head 9*b* each of which is composed of a metal material having conductivity are integrally formed with each other. Although the image display device 4 is provided with fastening members that fasten respective parts to each other in addition to the fastening member 9, their explanations are omitted here.

Furthermore, the vehicular display device 1 according to the present embodiment explained above has, as illustrated in FIG. 2, FIG. 3, and FIG. 4, the fixing structure of the casing 2, the circuit board 3, and the image display device 4, in which each of the boss parts 41 includes a proximal portion 41*a*, an insertion portion 41*b*, and a threadedly engaging hole 41*c*. Due to such a structure, the vehicular display device 1 according to the present embodiment achieves the constitution in which the image display device 4, the circuit board 3, and the casing 2 are capable of being properly fixed to each other. In each of the boss parts 41, the proximal portion 41*a*, the insertion portion 41*b*, and the threadedly engaging hole 41*c* are integrally formed with each other, with the use of a metal material having conductivity. Since the plurality of boss parts 41 have respective constitutions substantially identical with each other, unless otherwise noted, the plurality of boss parts 41 are hereinafter explained in common with each other.

To be more specific, the proximal portion 41*a* is formed in a columnar shape projecting from the back side face of the plate-like portion 43*a* of the cover 43 in the depth direction X; that is, from the face of the plate-like portion 43*a* of the cover 43 that faces the circuit board 3 in the depth direction X, towards the circuit board-3 side of the plate-like portion 43*a* of the cover 43 along the depth direction X. In the present embodiment, the proximal portion 41*a* whose axis line is arranged along the depth direction X is formed in an approximately columnar shape having a diameter larger than those of the casing fastening hole 2*a* and the board fastening hole 3*a*. Due to such a structure, the proximal portion 41*a* is formed in an approximately columnar shape having a diameter larger than those of the casing fastening hole 2*a* and the board fastening hole 3*a* thus being constituted in such a manner that the proximal portion 41*a* is incapable of being inserted into the board fastening hole 3*a* and the casing fastening hole 2*a* along the depth direction X. Furthermore, the proximal portion 41*a* forms a contact surface 41*e* with which the circuit board 3 is capable of being brought into contact in a distal end portion 41*d* thereof in the depth direction X; that is, in an end portion on the circuit board-3 side thereof (an end portion thereof that is opposite to the plate-like portion 43*a*). The contact surface 41*e* is constituted of a distal-end surface on the back face side of the proximal portion 41*a* in the depth direction X; that is, on the circuit board-3 side of the proximal portion 41*a*.

The insertion portion 41*b* is formed in a columnar shape projecting from the distal end portion 41*d* of the proximal portion 41*a* in the depth direction X towards the circuit board-3 side of the proximal portion 41*a* along the depth direction X. In the present embodiment, the insertion portion 41*b* whose axis line is arranged along the depth direction X is formed in an approximately columnar shape. The insertion portion 41*b* whose axis line coincides with the axis line of the proximal portion 41*a* is formed in an approximately columnar shape having a diameter smaller than those of the proximal portion 41*a*, the casing fastening hole 2*a*, and the board fastening hole 3*a*. In the boss part 41, the insertion portion 41*b* whose axis line coincides with the axis line of the proximal portion 41*a* is formed in a shape having a diameter smaller than that of the proximal portion 41*a* thus forming a stepped portion in the distal end portion 41*d* of the proximal portion 41*a*, the stepped portion constituting the distal-end surface of the proximal portion 41*a*; that is, the stepped portion constituting the contact surface 41*e*. Furthermore, the insertion portion 41*b* is formed in an approximately columnar shape having a diameter smaller than those of the casing fastening hole 2*a* and the board fastening hole 3*a* thus being constituted in such a manner that the insertion portion 41*b* is capable of being inserted into the board fastening hole 3*a* and the casing fastening hole 2*a* along the depth direction X.

The threadedly engaging hole 41*c* is formed from a distal end 41*f* of the insertion portion 41*b* in the depth direction X; that is, from an end on the circuit board-3 side of the insertion portion 41*b* (an end on the side opposite to the proximal portion 41*a*), toward the proximal portion 41*a* along the depth direction X. The threadedly engaging hole 41*c* has a thread groove capable of being threadedly engaged with the fastening member 9, the thread groove being formed in the inner peripheral face of the threadedly engaging hole 41*c*. The threadedly engaging hole 41*c* is formed in an extending manner from the distal end 41*f* of the insertion portion 41*b* to the proximal portion 41*a* along the depth direction X. In other words, it is also possible to explain as follows; that is, the formation of the threadedly engaging hole 41*c* causes the proximal portion 41*a* and the insertion portion 41*b* to be entirely formed in an approximately cylindrical shape.

Each of the boss parts 41 is formed separately from the cover 43 and thereafter, the proximal portion-41*a* side of the boss part 41 is caulked onto the plate-like portion 43*a* of the cover 43 from the front face side of the cover 43 in the depth direction X thus integrating the boss parts 41 with the plate-like portion 43*a*. Here, each of the boss parts 41 is not limited to this example, and the proximal portion 41*a*, the insertion portion 41*b*, and the threadedly engaging hole 41*c* may be integrally formed with the cover 43, with the use of a metal material having conductivity.

The insertion portion 41*b* of the boss part 41 constituted as described above is inserted into the board fastening hole 3*a* and the casing fastening hole 2*a* in this order in a state that the cover 43 is attached to the display device body 42. The boss part 41 is held in a state that the insertion portion 41*b* is inserted into the board fastening hole 3*a* and the casing fastening hole 2*a* along the depth direction X thus maintaining the appropriate positional relation among the image display device 4, the circuit board 3, and the casing 2. Furthermore, in the boss part 41, the shank 9*a* of the fastening member 9 is threadedly engaged with the threadedly engaging hole 41*c* along the depth direction X from the back face side of the casing 2 in the depth direction X. Due to such a structure, the boss part 41 is capable of fixing the circuit board 3 and the casing 2 that are sandwiched between the head 9*b* of the fastening member 9 that is threadedly engaged with the threadedly engaging hole 41*c* along depth direction X and the contact surface 41*e*. That is, in the vehicular display device 1, the fastening member 9 and the boss part 41 is capable of fastening the image display device 4, the circuit board 3, and the casing 2 together with each other.

Here, each of at least one of the plurality of casing fastening holes 2*a* and at least one of the plurality of board fastening holes 3*a* may be formed in a shape having an inside diameter slightly larger than the outside diameter of the insertion portion 41*b*, and each of the remaining casing fastening holes 2*a* and the remaining board fastening holes 3*a* may be an elongated hole extending along the width direction Y or the height direction Z, or may be formed in a shape having an inside diameter sufficiently larger than the outside diameter of the insertion portion 41*b*, so as to allow various tolerances.

Each of the casing 2, the fastening member 9, and the boss part 41 is, as mentioned above, composed of a metal material having conductivity. Here, the image display device 4, the circuit board 3, and the casing 2 are electrically conductive via the boss part 41 and the fastening member 9, and grounded via the circuit board 3. In the vehicular display device 1 according to the present embodiment, as indicated by an arrow in FIG. 4, the display device body 42 is electrically conductive to the wiring pattern (a part from which a resist layer is removed) of the mounting surface on the back face side of the circuit board 3 in the depth direction X; that is, on the casing-2 side of the circuit board 3, via the cover 43, the boss part 41, the fastening member 9, and the casing 2. Furthermore, the vehicular display device 1 is grounded to the body of a vehicle via the wiring pattern of the circuit board 3, the connector 31, the wiring material, or the like.

In the vehicular display device 1 explained heretofore, in a state that the image display device 4, the circuit board 3, and the casing 2 are arranged to face each other along the depth direction X, the image display device 4, the circuit board 3, and the casing 2 are capable of being fastened and fixed to each other by using the fastening members 9 by way of the boss parts 41, the board fastening holes 3*a*, and the casing fastening holes 2*a*. In this case, in the vehicular display device 1, the insertion portion 41*b* of each of the boss parts 41 arranged in the image display device 4 is inserted into the board fastening hole 3*a* and the casing fastening hole 2*a* along the depth direction X thus maintaining the appropriate positional relation among the image display device 4, the circuit board 3, and the casing 2. Furthermore, in the vehicular display device 1, the fastening member 9 is threadedly engaged with the threadedly engaging hole 41*c* formed in the distal end 41*f* of the insertion portion 41*b*. Due to such a structure, in the vehicular display device 1, the fastening member 9 threadedly engaged with the threadedly engaging hole 41*c* and the contact surface 41*e* formed in the proximal portion 41*a* of the boss part 41 are capable of fixing the circuit board 3 and the casing 2 that are sandwiched therebetween along the depth direction X. That is, in the vehicular display device 1, the boss part 41 arranged in the image display device 4 is capable of being used as a positioning part that mutually positions the image display device 4, the circuit board 3, and the casing 2 in common with a fixing part that fixes the image display device 4, the circuit board 3, and the casing 2 to each other. Furthermore, in the vehicular display device 1, the casing fastening hole 2*a* and the board fastening hole 3*a* are capable of being used as the positioning part in common with the fixing parts. Due to such a structure, in the vehicular display device 1, for example, it is possible to achieve space-saving and miniaturization as compared with the case where the positioning part and the fixing part are separately arranged, and it is possible to achieve, for example, the reduction of dead space in the circuit board 3, and further improve the density growth of wiring patterns. As a result, in the vehicular display device 1, it is possible to fix properly constitutional features to each other; that is, it is possible to fix properly the image display device 4, the circuit board 3, and the casing 2 to each other.

Furthermore, in the vehicular display device 1 explained heretofore, the image display device 4, the circuit board 3, and the casing 2 are electrically conductive via the boss part 41 and the fastening member 9, and grounded via the circuit board 3. Due to such a structure, in the vehicular display device 1, it is possible to ground the image display device 4, the circuit board 3, and the casing 2 through a relatively short and efficient channel thus achieving space-saving and miniaturization also in this respect, and further improving, for example, the density growth of the wiring patterns in the circuit board 3.

Furthermore, in the vehicular display device 1 explained heretofore, the image display device 4 includes the display device body 42, and the cover 43 in which the boss part 41 is formed. Due to such a structure, in the vehicular display device 1, the cover 43 is attached to the display device body 42 and thus the boss part 41 can be easily attached to the display device body 42. As a result, in the vehicular display device 1, for example, even when a general-purpose device is used as the display device body 42, it is possible to adopt a constitution in which the position and the number of the boss parts 41 are easily adjusted. The vehicular display device 1 is thus capable of, for example, improving the flexibility thereof, and suppressing a manufacturing cost.

Here, the vehicular display device 1 according to the embodiment of the present invention mentioned above is not limited to the above-mentioned embodiment, and various modifications can be made without departing from the gist of the descriptions in the claims.

As the wiring material 44 configured to connect the display device body 42 and the circuit board 3 that are explained heretofore, an electric wire, a metal rod, a bus bar, a plane circuit body (flexible printed circuits (FPC), flexible flat cable (FFC), for example), or the like can be used. Here, as the wiring material 44, for example, the FPC attached to the display device body 42 and the circuit board 3 in a detachable manner is used. In this case, the wiring material 44 arranges, for example, a plurality of terminals on both ends thereof. Furthermore, one end of the wiring material 44 is fitted in a connector 42*b* of the display device body 42, and the other end of the wiring material 44 is fitted in the connector 33 of the circuit board 3. Due to such a structure, the wiring material 44 is capable of electrically connecting the display device body 42 and the circuit board 3 with each other. In this case also, an intermediate circuit configuration is properly adjusted thus forming the wiring material 44 in such a manner that a terminal arrangement in one end of the wiring material 44 and a terminal arrangement in the other end of the wiring material 44 differ from each other. With this constitution, the wiring material 44 can also be formed, for example, in such a manner that the terminal arrangement in the connector 42*b* and the terminal arrangement in the connector 33 have preferred arrangements corresponding to requests from the display device body 42 and the circuit board 3, respectively. In this case, the wiring material 44 can be formed, for example, in such a manner that a dummy terminal that does not constitute a circuit is arranged in one terminal arrangement, and the number of terminals (the number of pole arrangements) in one end of the wiring material 44 and the number of terminals (the number of pole arrangements) in the other end of the wiring material 44 differ from each other thus also achieving a structure capable of preventing erroneous assembling. In this case, in the wiring material 44, assuming a case where one end of the wiring material 44 that has terminals whose number is relatively large is inserted into a connector to be connected with the other end of the wiring material 44 that has terminals whose number is relatively small, the one end of the wiring material 44 is prevented from being inserted into the connector by the dummy terminal. As a result, it is possible for the wiring material 44 to prevent the erroneous assembling thus appropriately connecting the display device body 42 and the circuit board 3 with each other.

Although the explanation is made assuming that the casing 2, and the cover 43 including the fastening member 9 and the boss part 41 that are explained heretofore is composed of a metal material having conductivity, the present invention is not limited to this example, and each of them may be composed of a resin material having insulation properties. In this case, the image display device may be grounded via a channel different from the channel mentioned above.

Although the explanation is made assuming that the circuit board 3 explained heretofore is a printed circuit board, the present invention is not limited to this example, and the circuit board 3 may be, for example, an insert bus bar board in which a bus bar composed of a conductive metal material is built in the inside of an insulative resin material, and the bus bar constitutes various circuits.

Although the explanation is made assuming that the image display device 4 explained heretofore includes the display device body 42 and the cover 43, and the boss part 41 is formed in the cover 43, the present invention is not limited to this example, and the image display device 4 may be constituted in such a manner that the image display device 4 is not provided with the cover 43, and the boss part 41 is directly formed in the display device body 42.

Although the explanation is made assuming that the axis line of the insertion portion 41*b* explained heretofore coincides with the axis line of the proximal portion 41*a*, the present invention is not limited to this example, and the axis line of the insertion portion 41*b* may be eccentrically displaced from the axis line of the proximal portion 41*a*. Furthermore, the insertion portion 41*b* may have the distal end portion formed in a rounded shape, such as a curved shape.

In the vehicular display device according to the present embodiments, in a state that the image display device, the circuit board, and the casing are arranged to face each other along the first direction, the image display device, the circuit board, and the casing are capable of being fastened and fixed to each other with the use of the fastening members by way of the boss portions, the board fastening holes, and the casing fastening holes. In this case, in the vehicular display device, the insertion portion of each of the boss portions provided to the image display device is inserted into the board fastening hole and the casing fastening hole along the first direction, and thus the appropriate positional relation among the image display device, the circuit board, and the casing can be maintained. Furthermore, in the vehicular display device, the fastening member is threadedly engaged with the threadedly engaging hole provided to the distal end of the insertion portion. Due to such a structure, in the vehicular display device, the fastening member threadedly engaged with the threadedly engaging hole and the contact surface formed in the proximal portion of the boss part are capable of fixing the circuit board and the casing sandwiched therebetween along the first direction. As a result, the vehicular display device achieves the advantageous effect such that constitutional features; that is, the image display device, the circuit board, and the casing, are capable of being properly fixed to each other.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicular display device comprising:

an image display device configured to display an image with respect to vehicle information, and including a plurality of boss parts;

a circuit board arranged to face the image display device along a first direction, configured to control the image display device, and having a plurality of board fastening holes formed at respective positions opposed to the boss parts along the first direction in a penetrating manner along the first direction;

a casing arranged to face the circuit board along the first direction on a side opposite to the image display device with respect to the circuit board, configured to house the image display device and the circuit board, and having a plurality of casing fastening holes formed at respective positions opposed to the boss parts along the first direction in a penetrating manner along the first direction; and a plurality of fastening members configured to fasten and fix the image display device, the circuit board, and the casing to each other by way of the boss parts, the board fastening holes, and the casing fastening holes, wherein the boss parts include:

a proximal portion formed in a projecting manner along the first direction, and having a contact surface capable of being brought into contact with the circuit board on a distal end in the first direction;

an insertion portion formed in a projecting manner along the first direction from the distal end of the proximal portion in the first direction and being capable of being inserted into the board fastening holes and the casing fastening holes along the first direction; and a threadedly engaging hole formed from the distal end of the insertion portion in the first direction toward the proximal portion along the first direction, the fastening members being capable of being threadedly engaged with the threadedly engaging hole, the boss parts fix the circuit board and the casing sandwiched between the fastening members threadedly engaged with the threadedly engaging hole along the first direction and the contact surface, the casing, the fastening members, and the boss parts are composed of a metal material having conductivity, and the image display device, the circuit board, and the casing are electrically conductive via the boss parts and the fastening members, and grounded via the circuit board.

2. A vehicular display device comprising:

an image display device configured to display an image with respect to vehicle information, and including a plurality of boss parts;

a circuit board arranged to face the image display device along a first direction, configured to control the image display device, and having a plurality of board fastening holes formed at respective positions opposed to the boss parts along the first direction in a penetrating manner along the first direction;

a casing arranged to face the circuit board along the first direction on a side opposite to the image display device with respect to the circuit board, configured to house the image display device and the circuit board, and having a plurality of casing fastening holes formed at respective positions opposed to the boss parts along the first direction in a penetrating manner along the first direction; and a plurality of fastening members configured to fasten and fix the image display device, the circuit board, and the casing to each other by way of the boss parts, the board fastening holes, and the casing fastening holes, wherein the boss parts include:

a proximal portion formed in a projecting manner along the first direction, and having a contact surface capable of being brought into contact with the circuit board on a distal end in the first direction;

an insertion portion formed in a projecting manner along the first direction from the distal end of the proximal portion in the first direction and being capable of being inserted into the board fastening holes and the casing fastening holes along the first direction; and a threadedly engaging hole formed from the distal end of the insertion portion in the first direction toward the proximal portion along the first direction, the fastening members being capable of being threadedly engaged with the threadedly engaging hole, the boss parts fix the circuit board and the casing sandwiched between the fastening members threadedly engaged with the threadedly engaging hole along the first direction and the contact surface, and the image display device includes a display device body configured to display an image with respect to the vehicle information, and a cover provided with the boss parts, the cover being attached to the display device body in a detachable manner.

3. The vehicular display device according to claim 1, wherein the image display device includes a display device body configured to display an image with respect to the vehicle information, and a cover provided with the boss parts, the cover being attached to the display device body in a detachable manner.

* * * * *